(12) United States Patent
Bugg

(10) Patent No.: US 6,586,944 B1
(45) Date of Patent: Jul. 1, 2003

(54) APPARATUS FOR CREATING STATIC IN A TELEPHONE LINE

(75) Inventor: Kenneth F. Bugg, Decatur, GA (US)

(73) Assignee: BellSouth Intellectual Property Corporation, Wilmington, DE (US)

(*) Notice: Subject to any disclaimer, the term of this patent is extended or adjusted under 35 U.S.C. 154(b) by 31 days.

(21) Appl. No.: 09/725,729

(22) Filed: Nov. 29, 2000

(51) Int. Cl.[7] .............................................. G01R 29/00
(52) U.S. Cl. ....................... 324/522; 324/500; 324/691; 324/696
(58) Field of Search ................................ 324/522, 509, 324/525, 689, 696, 691, 500

(56) References Cited

U.S. PATENT DOCUMENTS

| | | | | |
|---|---|---|---|---|
| 3,412,325 A | * | 11/1968 | Soderling | 324/693 |
| 4,057,775 A | * | 11/1977 | Biller | 337/186 |
| 4,137,931 A | * | 2/1979 | Hasenbeck | 324/689 X |
| 4,506,249 A | * | 3/1985 | Huber et al. | 337/232 |
| 4,531,087 A | * | 7/1985 | Larson | 324/696 |
| 5,015,958 A | * | 5/1991 | Masia et al. | 324/522 |
| 5,728,485 A | * | 3/1998 | Watanabe et al. | 429/41 |
| 5,904,832 A | * | 5/1999 | Cliffors et al. | 205/756 |
| 6,026,145 A | * | 2/2000 | Bauer et al. | 379/26 |
| 6,201,853 B1 | * | 3/2001 | Butler et al. | 379/21 |

OTHER PUBLICATIONS

C*CHEM Brochure, printed from the World Wide We. Nov. 5, 2002.*

* cited by examiner

Primary Examiner—N. Le
Assistant Examiner—T. R. Sundaram
(74) Attorney, Agent, or Firm—Woodcook Washburn LLP

(57) ABSTRACT

Apparatus and methods for creating a fault such as a varying resistance fault causing static are disclosed. Devices according to the invention include a housing having an entrance face and defining an interior region, a quantity of granular electrically conductive material contained within the interior region, and a pair of electrical conductors extending through the entrance face of the housing, each conductor having a first portion that extends into the interior region of the device. Each of the first portions includes a distal portion that is in electrical contact with the granular conductive material, and the quantity of granular material is such that the granular material provides an intermittent electrical connection between the distal portions.

12 Claims, 2 Drawing Sheets

APPARATUS FOR CREATING STATIC IN A TELEPHONE LINE

FIELD OF THE INVENTION

This invention relates generally to the field of telephony, and in particular to devices for generating static in a telephone line.

BACKGROUND OF THE INVENTION

In telephone systems, telephone signals are typically carried by metallic telephone cables. A break in a telephone cable where the broken ends of the cable are closely proximate, can cause a fault condition, such as a varying resistance fault, causing static in a phone line. A fault such as a varying resistance fault can cause a disturbance within the frequency band of the telephone signal, causing static or other noise on the telephone line.

A telephone customer who experiences static on his telephone will typically place a service call to the phone company, necessitating the dispatch of a telephone repair technician to the customer's location. Once at the customer's location, the telephone technician must find the fault, and repair the break in the line or whatever is causing the static.

Finding a fault such as a varying resistance fault requires the use of an instrument such as a time domain reflectometer (TDR), for example. A TDR is a technologically complex instrument that assists in the characterization and location of faults in metallic cables, including faults such as the varying resistance fault. Training a technician to use a TDR properly is expensive and time-consuming. The problem is magnified because heretofore it has been difficult to reproduce a varying resistance fault in the laboratory. Clearly, it would be advantageous to both telephone service providers and their customers, if technicians were able to learn how to operate equipment such as a TDR in a controlled environment by creating or simulating known faults, rather than to learn "under fire" in the field. Thus a need in the art exists for a device that can create static in a telephone line so that technicians can be trained in-house to find and fix faults such as varying resistance faults that create such static.

SUMMARY OF THE INVENTION

The present invention satisfies the aforementioned needs in the art by creating a varying resistance fault when the device is installed in a telephone line. The varying resistance fault creates a noisy condition in the telephone, enabling the telephone technicians to be trained to find and fix the faulty condition in a laboratory rather than in the field.

According to the present invention, a device for generating a varying high-resistance fault comprises a housing made of an electrically insulating material, such as a plastic. The housing has an entrance face and defines an interior region of the device. A pair of electrical conductors extends through the entrance face. Each of the conductors has a first portion that extends into the interior region of the device, and a second portion that extends external to the housing. Each of the conductors has a distal portion contained within the housing. The conductors can be copper wires, for example, and can be coated on at least a portion thereof with an insulating sheathing material.

The housing contains a quantity of granular conductive material, such as carbon particles or metal shavings. The distal portion of each conductor is in electrical contact with the granular conductive material, and the quantity of granular material is such that the granular material provides an intermittent electrical connection between the distal portions of the conductors. The distal portions of the conductors can be exposed (i.e., not coated with the insulating sheathing material). Thus, a varying resistance fault causing static can be generated between the distal portions of the conductors by generating a potential difference therebetween.

A method according to the present invention for generating a varying resistance fault includes interposing a static creator such as described above into an electrical circuit by electrically coupling each of the conductors to corresponding conductive members of the circuit. A varying resistance fault can then be generated by applying a potential difference between the distal portions of the conductors to cause an intermittent current to flow therebetween.

BRIEF DESCRIPTION OF THE DRAWINGS

The foregoing summary, as well as the following detailed description of the preferred embodiments, is better understood when read in conjunction with the appended drawings. For the purpose of illustrating the invention, there is shown in the drawings an embodiment that is presently preferred, it being understood, however, that the invention is not limited to the specific methods and apparatus disclosed. In the drawings.

DETAILED DESCRIPTION OF PREFERRED EMBODIMENTS

Figure 1:
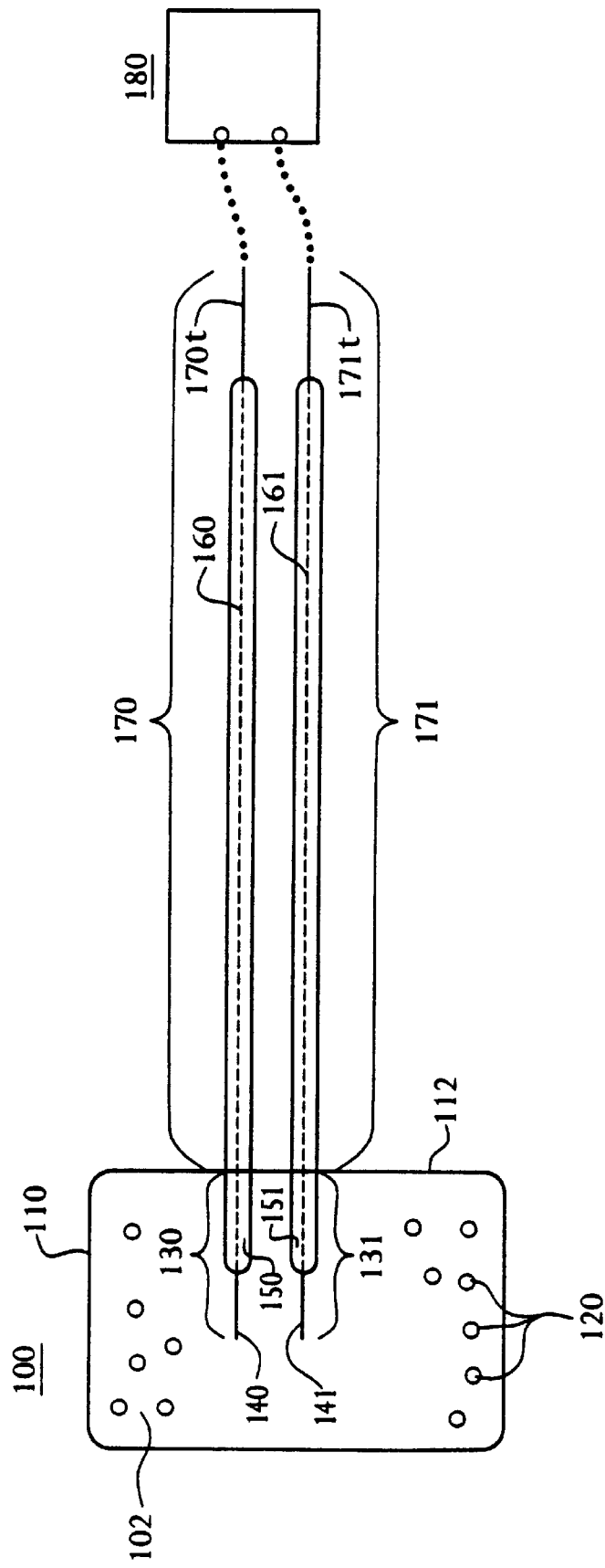
FIG. 1 depicts a static creator according to the present invention.

With reference to FIG. 1 it can be seen that a static creator 100 includes a housing 110 and two conductors 160, 161. Housing 110 can be constructed of any suitable electrically insulating material, such as plastic for example, and can be transparent, translucent, or opaque. Housing 110 includes an entrance face 112, and defines an interior region 102 of fault generator 100. In a preferred embodiment, housing 110 is a splice connector.

Each of conductors 160 and 161 extends through entrance face 112 of housing 110 and into interior region 102. Thus, a respective first, or internal, portion 130, 131 of each of conductors 160, 161 extends into interior region 102, and a respective second, or external, portion 170, 171 of each of conductors 160, 161 extends out of housing 110 as shown. External portions 170, 171 of conductors, 160, 161 can have any length, but preferably, are of sufficient length to permit ease of usage as described below.

Conductors 160, 161 can be made of any suitable conductive material, such as copper wire, for example. Preferably, conductor 160, 161 is coated with an electrically insulating sheathing material, 150, 151, such as polyvinyl chloride, for example, except for a respective distal portion 140, 141 of each where the conductor is exposed. Exposed distal portions 140, 141 of conductors 160, 161 are contained within interior region 102 and, preferably, are contained entirely within housing 110 so that no portion of either conductor 140, 141 is exposed external to housing 110.

According to the present invention, housing 110 also contains a quantity of a granular, conductive material 120, such as carbon particles, for example. The purpose of granular material 120 is to provide an intermittent conductive path between conductors 160 and 161, and thereby to create a varying resistance fault. Thus, the quantity of granular material 120 contained within housing 110 must be sufficient to complete an electric circuit between distal portions 140, 141 of conductors 160, 161 when an potential difference is applied between their terminal ends 170t, 171t (e.g., by connecting terminal ends 170t, 171t to a power source 180). At the same time, however, the quantity of granular material 120 must be limited so that the electrical connectivity between conductors 160 and 161 is intermittent. Consequently, the probability that the circuit between conductors 160 and 161 would be complete can be adjusted by adjusting the quantity of granular material 120 contained within housing 110. In a preferred embodiment of the invention, the granular material 120 includes carbon particles that are about 2–3 mm in size.

It should be understood that, although carbon particles are provided as an exemplary description herein, any material, such as metal shavings for example, that is suitable for creating intermittent connectivity between conductors 160 and 161 can be used in accordance with the present invention.

Figure 2:
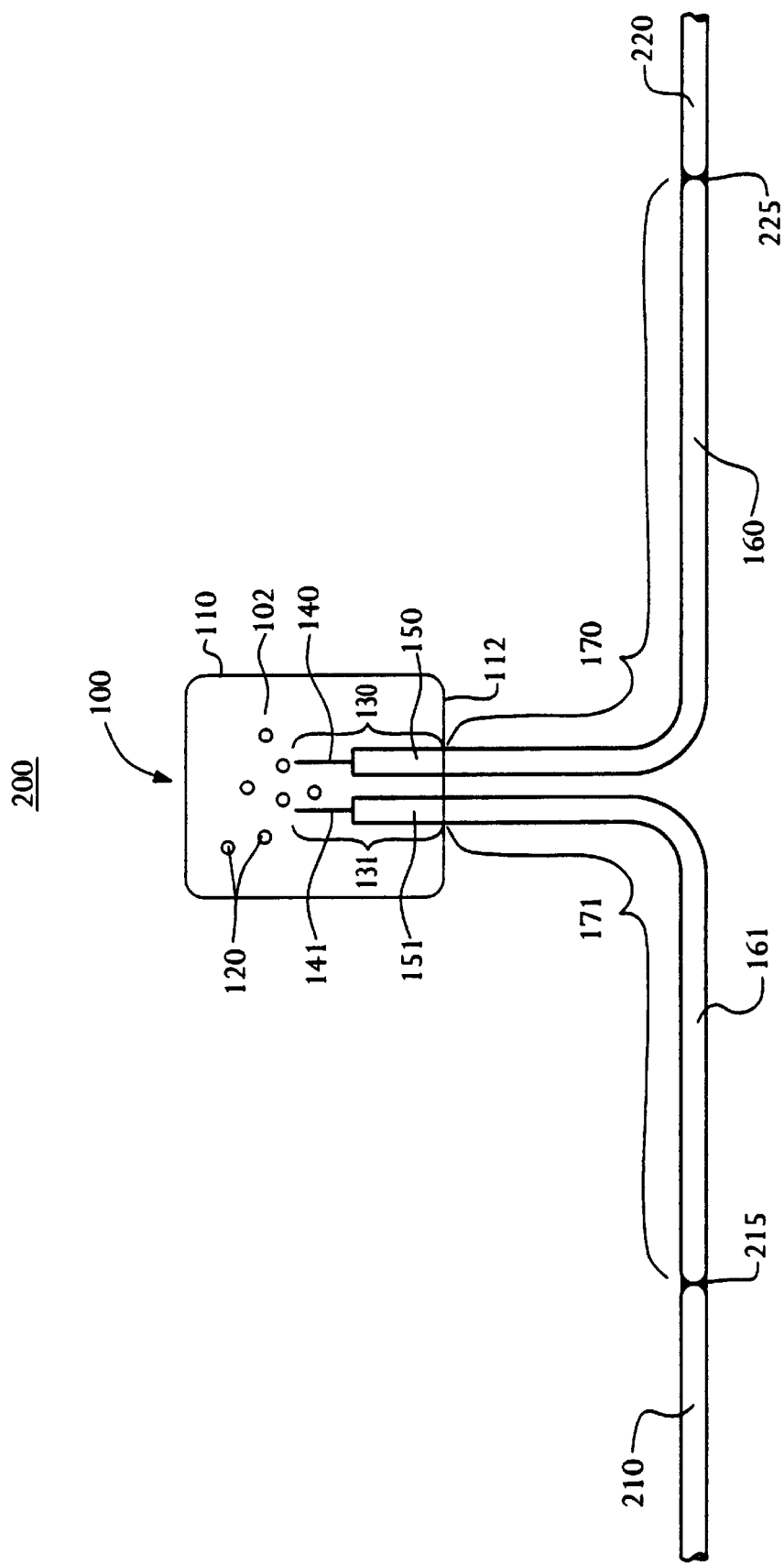
FIG. 2 depicts a static creator according to the present invention interposed within a circuit.

With reference to FIG. 2, it can be seen that a varying resistance fault may be created when a static creator 100 according to the present invention is interposed within an electrical circuit, generally designated 200. As shown, circuit 200 can include a plurality of electrical conductors 210, 220, which could be, for example, part of a simulated telephone installation in a test environment. Preferably, static creator 100 is interposed into circuit 200 by electrically coupling (such as by splicing or by any other suitable method for electrically connecting conductors) a first conductor of generator 100, such as conductor 160, for example, to a first conductor 220 of circuit 200 at point 225. Similarly, conductor 161 of generator 100 is electrically coupled to a second conductor 210 of circuit 200 at point 215. Thus, when a potential difference is applied between conductors 210 and 220, an electrical circuit 200 including a varying resistance fault is completed. Circuit 200 can then be used as a training tool to teach a person, such as a telephone technician, how to locate and repair a fault such as a varying resistance fault.

Thus there have been described apparatus and methods for creating static caused by varying resistance fault in an electrical circuit. Those skilled in the art will appreciate that numerous changes and modifications may be made to the preferred embodiments of the invention and that such changes and modifications may be made without departing from the spirit of the invention. It is therefore intended that the appended claims cover all such equivalent variations as fall within the true spirit and scope of the invention.

I claim:

1. A device for creating a fault in an electrical circuit, the device comprising:

a housing having an entrance face and defining an interior region;

a quantity of granular electrically conductive material contained within the interior region defined by the housing; and a pair of electrical conductors extending through the entrance face of the housing, each said electrical conductor having a first portion that extends into the interior region and makes electrical contact with the granular conductive material, wherein the quantity of granular material is such that the granular material exhibits a varying resistance and generates electrical noise when a potential difference is applied between said pair of electrical conductors.

2. The device of claim 1, wherein the housing comprises an electrically insulating material.

3. The device of claim 2, wherein the insulating material comprises a plastic.

4. The device of claim 1, wherein the granular conductive material comprises carbon.

5. The device of claim 4, wherein the granular conductive material comprises a plurality of carbon particles.

6. The device of claim 5, wherein at least a portion of the carbon particles have a size ranging from about 2 to about 3 mm.

7. The device of claim 1, wherein the conductive material comprises metal particles.

8. The device of claim 1, wherein each of the electrical conductors comprises a metal wire and is coated on at least a portion thereof with an electrically insulating sheathing material.

9. The conductor of claim 8, wherein a distal portion of each of the electrical conductors is not coated with the insulating sheath material.

10. A method for creating a fault in an electrical circuit, the method comprising:

providing an electrical noise creation device comprising:
a housing having an entrance face and defining an interior region;
a quantity of granular electrically conductive material contained within the interior region defined by the housing; and
a pair of electrical conductors extending through the entrance face of the housing, each said electrical conductor having a first portion that extends into the interior region and makes electrical contact with the granular conductive material,
wherein the quantity of granular material is such that the granular material exhibits a varying resistance and generates electrical noise when a potential difference is applied between said pair of electrical conductors;

interposing said electrical noise creation device into said electrical circuit by electrically coupling each of the electrical conductors to corresponding electrically conductive members of the circuit; and applying said potential difference to said corresponding electrically conductive members of the circuit.

11. The method according to claim 10, wherein said electrical circuit is one or more of the group consisting of a metallic cable, a telephone line and a simulated telephone line.

12. The method according to claim 10, wherein said potential difference is generated by a time domain reflectometer.

* * * * *